(12) United States Patent
Kurosawa

(10) Patent No.: US 7,315,350 B2
(45) Date of Patent: Jan. 1, 2008

(54) EXPOSURE APPARATUS, RETICLE SHAPE MEASUREMENT APPARATUS AND METHOD

(75) Inventor: Hiroshi Kurosawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 133 days.

(21) Appl. No.: 10/843,462

(22) Filed: May 12, 2004

(65) Prior Publication Data

US 2004/0227918 A1    Nov. 18, 2004

(30) Foreign Application Priority Data

May 16, 2003    (JP)    ............................. 2003-138993

(51) Int. Cl.
*G03B 27/52*    (2006.01)
*G03B 27/42*    (2006.01)

(52) U.S. Cl. .......................................... 355/55; 355/53

(58) Field of Classification Search ................... 355/55, 355/72, 75, 53, 52, 67, 77; 356/601, 609, 356/61, 399–401; 250/548; 430/311
See application file for complete search history.

(56) References Cited

U.S. PATENT DOCUMENTS

| | | | | |
|---|---|---|---|---|
| 5,539,521 A | * | 7/1996 | Otokake et al. ............ | 356/601 |
| 5,640,227 A | | 6/1997 | Kato et al. ................. | 355/53 |
| 5,657,130 A | * | 8/1997 | Shirasu et al. ............. | 356/401 |
| 6,023,320 A | * | 2/2000 | Kawashima ................ | 355/53 |
| 6,262,792 B1 | * | 7/2001 | Higashiki .................. | 355/52 |
| 6,657,703 B2 | | 12/2003 | Kurosawa .................. | 355/55 |
| 6,738,128 B2 | * | 5/2004 | Shima et al. ............... | 355/52 |
| 2002/0041368 A1 | * | 4/2002 | Ota et al. ................... | 355/55 |
| 2002/0145716 A1 | | 10/2002 | Kurosawa .................. | 355/55 |
| 2003/0090640 A1 | * | 5/2003 | Fujisawa et al. ........... | 355/53 |

FOREIGN PATENT DOCUMENTS

| | | |
|---|---|---|
| JP | 6-36987 | 2/1994 |
| JP | 7-272999 | 10/1995 |
| JP | 2002-222760 | 8/2002 |

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus exposes a substrate to light via a reticle while the substrate and the reticle are scanned based on information regarding a shape of the reticle. A projection optical system projects a reticle pattern onto the substrate and a reticle stage holds the reticle and moves in the scanning direction. A measurement system measures a position of the reticle surface in the optical axis direction. Information is generated on a position of each measurement point of the surface in the scanning direction with respect to which the measurement system measures a surface position based on pattern information. The measurement performed with respect to each measurement point is used to obtain reticle shape information. The position of the reticle stage and operation of the measurement system is controlled based on the generated information and the reticle stage position information.

12 Claims, 14 Drawing Sheets

FIG. 12

Shot Information

| | | |
|---|---|---|
| Area X | 26.000 | mm |
| Area Y | 33.000 | mm |
| Center X | 0.000 | mm |
| Center Y | 0.000 | mm |

Further Info.

FIG. 13

Chip Information

Shot Segmentation

Shot Segmentation X　[ 2 ]　Chips

Shot Segmentation Y　[ 4 ]　Chips

ROPTF Measurement Point Definition(Y)　[ AUTO ]

Measurement Start Point (On Chip)　[ 0.8 ] mm

Measurement Interval (On Chip)　[ 0.8 ] mm

EXPOSURE APPARATUS, RETICLE SHAPE MEASUREMENT APPARATUS AND METHOD

FIELD OF THE INVENTION

The present invention relates to a method of measuring a reticle shape applicable to an exposure apparatus.

BACKGROUND OF THE INVENTION

In focus tilt control in a scan exposure apparatus, a drive profile for a wafer stage is calculated to align the position of a wafer surface with an image focus surface of a reticle plate. Regarding this technique, Japanese Patent Application Laid-Open No. 2002-222760 discloses a method of holding a stage drive profile for each reticle. The distortion of a reticle in the X and Y directions is previously measured and a stage drive profile for a currently-exposed stage is generated based on the measurement.

Further, Japanese Patent Application Laid-Open No. 6-36987 discloses a method of obtaining deflection and tilt of a reticle held on a reticle stage by irradiating a pattern on a reference member on the wafer stage side from a position thereunder and detecting light reflected from the reticle as a photoelectric signal, thereby obtaining an optimum image surface. Further, Japanese Patent Application Laid-Open No. 7-272999 discloses a method of measuring the position of a reticle surface while scanning the reticle with plural focus measurement sensors arranged in a non-scan direction, and measuring focus and shape in a tilt direction of the reticle attracted to a reticle stage.

In the above-described conventional techniques, the measurement of a reticle shape is made by emitting measurement light on the surface of the reticle. However, as a pattern exists on the reticle surface, the reticle shape is measured by actually emitting the measurement light on the reticle pattern surface. In this case, erroneous measurement of a focus value caused by misalignment of the reticle pattern drawn on the reticle causes an error, which may degrade the accuracy of the reticle shape measurement. The error of alignment of the reticle pattern surface in a focus direction, by one over the projection magnification to the power of two, influences an image focus surface in the focus direction. Generally, the thickness of a chrome pattern drawn on a reticle is about 100 to 200 nm, and through a one-quarter scale projection optical system, an error up to 6.25 to 12.5 nm may be generated. For example, the best focus width of an ArF scan exposure apparatus with a line width of 0.08 μm (L/S) is about 300 nm. The error allocated to a focus positioning factor upon exposure is 40 to 50 nm, which cannot be ignored. The error of the focus value degrades the resolution performance upon scan exposure.

SUMMARY OF THE INVENTION

The present invention has been made in consideration of the above problem, and has its object to eliminate the influence of a reticle pattern in measurement of reticle focus position and to enable exposure processing with excellent resolution.

An exposure apparatus according to the present invention to attain the above object has the following construction. That is, provided is a surface shape measurement apparatus comprising a stage which carries a substrate on which plural chip patterns are arranged in a predetermined direction and to move in the predetermined direction, a sensor which measures a surface position of the substrate placed on the stage in a focus direction, a setting unit configured to set a measurement position to the same position in at least two chip patterns of the plural chip patterns, a control unit configured to perform measurement by the sensor in the measurement position set by the setting unit while moving the stage in the predetermined direction, and an estimation unit configured to estimate a deflection shape of the substrate in the predetermined direction based on the surface position obtained by the measurement performed by the control unit.

Further, according to the present invention, a reticle shape measurement apparatus and method are provided.

Other features and advantages of the present invention will be apparent from the following description taken in conjunction with the accompanying drawings, in which like reference characters designate the same name or similar parts through the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 12 is an example of a user interface to input a shot size 901;

FIG. 13 is an example of a user interface of a chip division information setting screen.

DETAILED DESCRIPTION OF THE PREFERRED EMBODIMENT

A preferred embodiment of the present invention will now be described in detail in accordance with the accompanying drawings.

According to the present embodiment, an exposure apparatus or a reticle shape measurement apparatus installable in the exposure apparatus has a function of arbitrarily designating an arrangement of focus measurement points on a reticle, within each chip pattern of the reticle. The arrangement of reticle surface measurement points can be made in correspondence with a repetition interval of chip layout on a reticle original plate. Thus, erroneous measurement due to misalignment in a pattern drawn on a reticle can be prevented. Further, according to the present embodiment, as the apparatus has a function of measuring plural reticle OPTF (Optical Tilt & Focus) at an in-shot chip layout interval and a function of interpolation-calculating the result of measurement of plural reticle OPTFs based on the chip layout interval, the apparatus can generate and hold a reticle surface shape correction table with higher continuity. The correction table is referred to upon correction of driving of a stage (wafer stage or reticle stage or both upon exposure processing, thereby, the distance between the reticle and the wafer (focus position) can be held with high accuracy, and exposure can be performed with excellent resolution performance.

Figure 1:
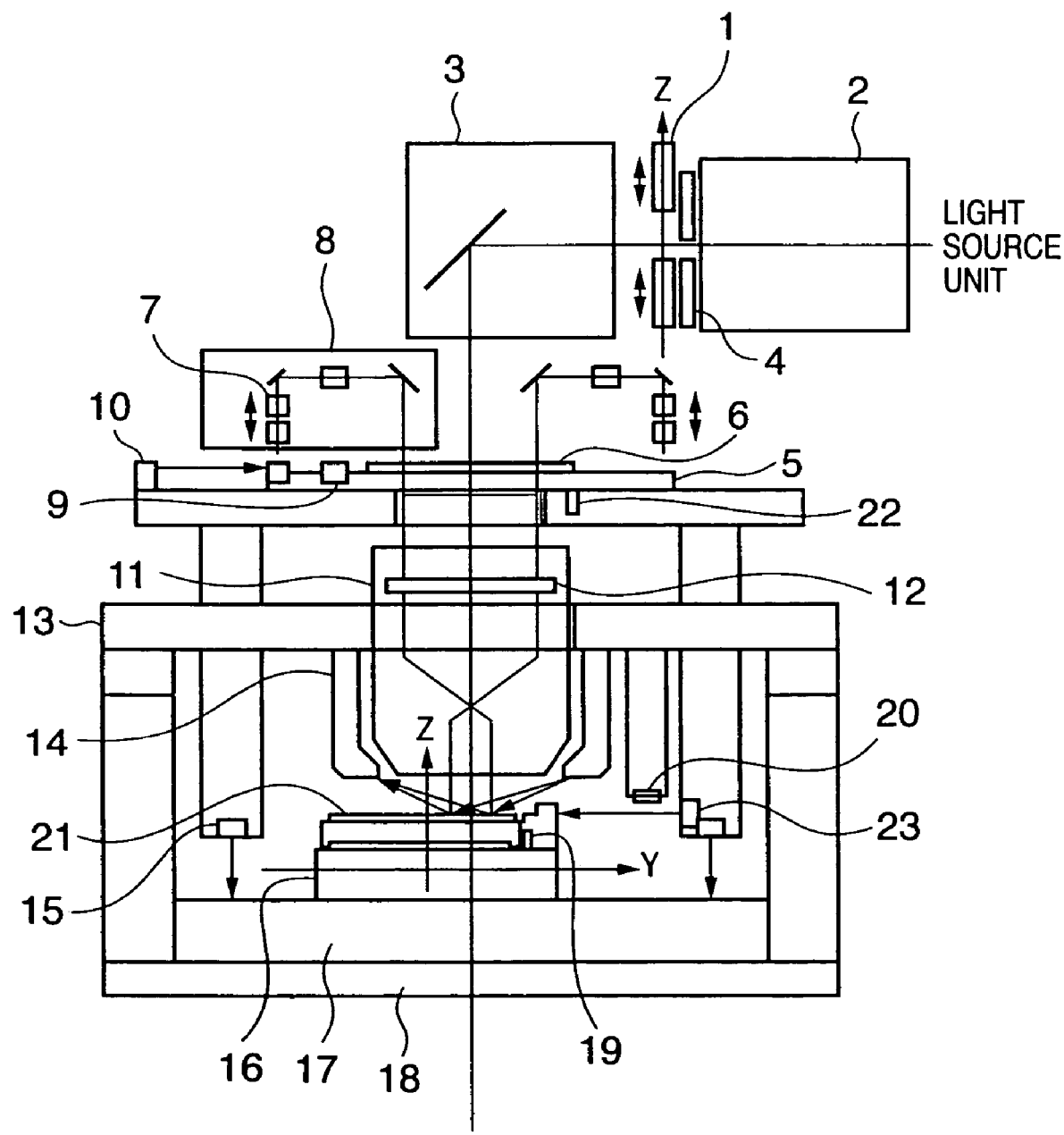
FIG. 1 is a schematic cross-sectional view showing the structure of a scan exposure apparatus according to an embodiment of the present invention.

FIG. 1 is a schematic cross-sectional view showing the structure of a scan exposure apparatus according to an embodiment of the present invention. Exposure light outputted from a light source, such as an excimer laser, arrives at a slit 4 via a first condenser lens group 2. The slit 4 shapes the exposure light to a slit-shaped beam having a width of about 7 mm in a Z-axial direction, and adjusts intensity of illumination integrated in the Z-axial direction to uniform illumination in a predetermined range in an X-axial direction. A masking blade 1 moves following the end of a pattern drawing angle of a reticle (original plate) 6 upon exposure with scanning of a reticle stage (original plate stage) 5 and a wafer stage (substrate stage) 16 (the masking blade is driven to always block light to a portion out of a pattern-drawn area on the reticle in synchronization with the scanning of the reticle stage). Note that, upon exposure, the reticle stage 5 and the wafer stage 6 both move in a Y-axial direction and in opposite directions.

The masking blade 1 prevents light projection on a wafer 21 by emission of exposure light on a light transmission portion of the reticle 6 while the reticle stage 5 is decelerated after the completion of transfer of the pattern on the reticle 6. The exposure light passed through the masking blade 1 is emitted on the reticle 6 on the reticle stage 5 via a second condenser lens group 3. The exposure light passed through the pattern of the reticle 6 forms an image of the pattern around the surface of the wafer (substrate) 21 through a projection lens 11. An NA (Numerical Aperture) controller 12 is provided in the projection lens 11 to change an illumination mode upon exposure.

A TTL scope 8 movable in a one-dimensional direction measures positions of alignment marks formed on the reticle 6 and the wafer 21 or a reference mark 19 on the wafer stage 16 in the X-axial, Y-axial and Z-axial directions, with an absolute reference position of the TTL scope as a reference. A relay lens 7 is used for adjusting focus of the TTL scope 8. The focus (position in the Z-axial direction) of the subject of detection can be measured by referring to the position of the relay lens 7 in a status where the alignment marks are in best focus. In FIG. 1, two TTL scopes 8 are provided along the Y direction for the sake of illustration, however, additional TTL scopes are provided in the X direction of these directions. In this arrangement of these TTL scopes, the tilt in the ωx, ωy directions between the reticle alignment mark and the mark on the wafer 21 or the wafer reference mark 19 can be measured. The TTL scopes 8 in FIG. 1 can be driven in an angle of view central direction (Y-axial direction).

The reticle stage 5 is controlled in the Y, Y and θ directions by utilization of three reticle laser interferometers 10. In FIG. 1, only one reticle laser interferometer 10 is shown. However, actually, two laser interferometers 10 are provided along the Y axis and further, two laser interferometers 10 are provided in the X-axial directions of these directions. The reticle stage 5 is movable in the X, Y and θ directions along a guide provided on a lens barrel platen 13. Regarding the Y axis, the reticle stage 5 is movable in a long stroke to execute scan exposure with movement in synchronization with the wafer stage 16. Regarding the X and θ axes, as slight movement is sufficient to resolve an error upon suction of reticle 6 on the reticle stage 5, the reticle stage 5 is movable only within a small range. As the exposure apparatus has a structure wherein a reaction force upon driving of the reticle stage 5 is let out to a reaction force absorption device (not shown) connected to a base plate 18, swing of the lens barrel platen 13 due to counter-reaction of driving does not occur. A reticle reference plate 9 is mounted on the reticle stage 5, and a mark observable by the TTL scope 8 is drawn on the reference plate 9.

Reference numeral 14 denotes a focus detector which obtains a focus value on the wafer surface by diagonally emitting measurement light from a light emitting device, such as a laser diode, to the subject. More particularly, the focus detector 14 is provided with a photoreception unit which receives reflected light from the subject of measurement and can measure the position of a reflected light spot. As the position of the reflected light spot on the photoreception unit side varies in correspondence with variations of the position of the subject of measurement, the focus value in a measurement light projected position on the wafer can be obtained by measuring the position of a center of gravity of the photoreception spot.

The focus detector 14 measures the position of the wafer 21 placed on the wafer stage (substrate stage) 16 or the reference mark 19 in the Z, ωx and ωy directions at a high speed without the projection lens 11. The focus detector 14 is used for focus detection upon exposure with synchronized scanning of the reticle stage 5 and the wafer stage 16. To assure long-term stability in measurement accuracy, the focus detector 14 performs self calibration by comparing the result of measurement of the reference mark 19 on the wafer stage 16 by the TTL scope 8 with the result of measurement by the focus detector 14.

An off-axis scope 20 has a single-lens focus measurement function and an XY-directional alignment error measurement function. Upon alignment of a wafer in a normal mass production job, global tilt measurement and global alignment measures are performed by using the off-axis scope 20. Global tilt correction amount and global alignment correction amount are used at once upon stepping of the wafer stage 16 to set an exposure area of the wafer to a position below the projection lens 11.

Note that global tilt means performs focus measurement in a predetermined in-shot position of previously-defined plural sample shots and obtains a primary approximate plane. Further, the global alignment means performs alignment measurement in a predetermined in-shot position of previously-defined plural sample shots and obtains rectangularity regarding the shot array, shift, magnification, chip rotation, and the like. Upon execution of alignment measurement, it is necessary to perform positioning to a focus position where the alignment mark can be measured with sufficient contrast without causing a measurement error. At this time, the focus measurement and stage driving in the Z direction are performed. The amount of stage driving in the Z direction and the focus measurement value can be used in global tilt calculation. The value of global tilt is used as an initial target value for the wafer stage in the following scan exposure.

The lens barrel platen 13 is a base plate to which high-accuracy measurement devices of the exposure apparatus are attached. The lens barrel platen 13 is positioned in a state in which it is slightly floated by a small amount from a base plate 18 directly placed on the floor. As the above-described focus detector 14 and the TTL scopes 8 are attached to the lens barrel platen 13, measurement values from these measurement devices correspond to measurement of relative distances from the lens barrel platen 13. An inter-platen interferometer 15 measures a relative positional relation between the lens barrel platen 13 and a stage platen 17. In the present embodiment, control is performed (to be described with reference to FIG. 6) such that the sum of the result of measurement by the inter-platen interferometer 15 and the results of measurement by the sensors in the three Z axes (not shown) installed in the wafer stage 16 corresponds with a target value designated from a higher unit in accordance with an exposure sequence. In this arrangement, the wafer 21 on the wafer stage 16 is held with respect to the lens barrel platen 13 in correspondence with the target value designated from the higher sequence in the focus direction. A wafer stage interferometer 22 is provided in three positions, as in the case of interferometers for the reticle stage 5, and utilized in control of the wafer stage 16 in the X, Y and θ directions.

The stage platen 17 is positioned in a state in which it is floated by a small amount from the base plate 18, as in the case of the lens barrel platen 13. The stage platen 17 has a function of eliminating vibration transmitted from the floor via the base plate 18 to the wafer stage 16 and a function of reducing a reaction force upon drive of the wafer stage 16 and letting the force out to the base plate 18. The wafer stage 16 is mounted in a state in which it is floated by a slight distance from the stage platen 17.

Numeral 22 denotes a reticle focus measurement device which measures the position of the pattern drawing surface of the reticle 6 suction-held on the reticle stage 5 in the focus direction. The reticle focus measurement device 22 is a focus measurement sensor in which plural measurement points are arranged in a vertical direction to the paper surface of FIG. 1. As its measurement method, the position of the center of gravity of reflected light is measured as in the case of the focus detector 14. When the reticle stage 5 moves in the Y direction where its position is measured by the laser interferometer 10, focus measurement of the reticle pattern surface can be made in an arbitrary position in the Y direction.

Then, focus measurement information on the measured reticle surface is stored in a storage device (not shown), and used upon correction of a target position trail of the wafer stage 16, which scan-operates upon exposure processing on the wafer 21 in the focus/tilt direction.

Figure 10:
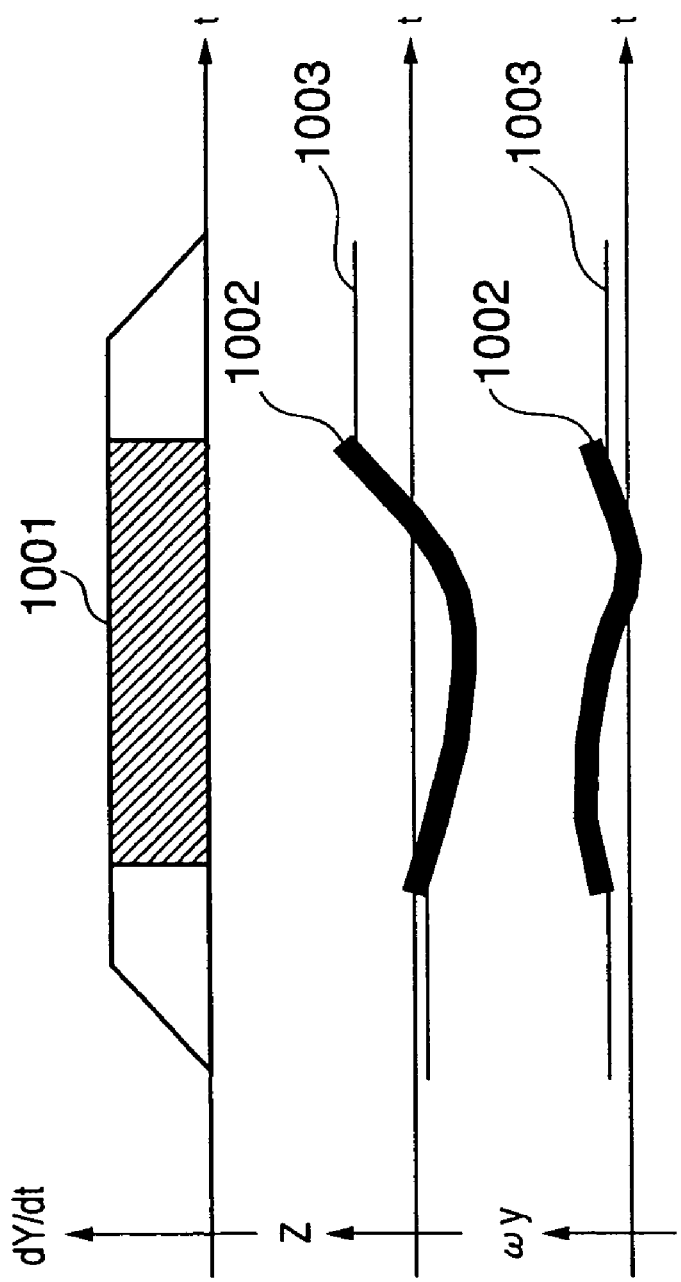
FIGS. 10A to 10C are graphs showing trails of wafer stage target values reflecting the result of focus measurement of a reticle surface.

FIGS. 10A to 10C are graphs showing particular examples of reflected correction amounts. FIG. 10A shows time variations of reticle scan speed and wafer exposure sections in a case wherein the reticle scan direction is along the Y axis. FIG. 10B shows the trail of the drive target value of the wafer stage in the Z axis. FIG. 10C shows the drive target value of the wafer stage in the ωy axis. Note that FIGS. 10A to 10C are based on a common time axis.

In the present embodiment, as there is no driving axis in the focus (Z) and tilt ($\omega x$, $\omega y$) directions in the reticle stage 5, variation of image surface position in the focus and tilt directions in accordance with the reticle is corrected by driving the wafer stage side. That is, the result of reticle shape measurement to be described later is added to the target position trails of the wafer stage 16 in the focus and tilt directions, thereby a stage trail 1003 can follow an image surface trail 1002 where the reticle image is formed. Further, in actual designing, the measurement value of the focus detector 14 on the wafer side is also used in calculation of focus and tilt amounts of the stage during scan-exposure. Accordingly, the above amount of reticle deflection is reflected in the target value of the wafer stage, and further, must be reflected in the result of measurement in each scan position of the focus detector 14.

Note that it is apparent that the same advantage can be obtained by providing the tilt and focus directional driving axes on the reticle stage 5 side and performing similar correction.

Figure 2:
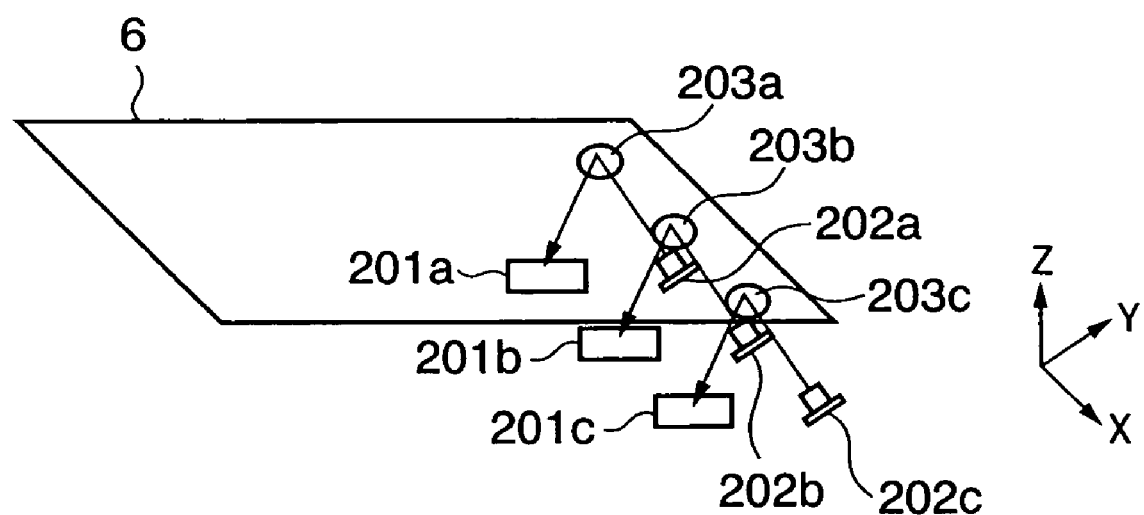
FIG. 2 is a schematic diagram showing the details of a reticle stage measurement device according to the embodiment.

FIG. 2 is a schematic diagram showing the details of the reticle stage measurement device 22 according to the embodiment. Light projection devices 202a to 202c emit measurement light for focus measurement on the reticle 6 and for measurement light spots 203a to 203c on the reticle. Photoreception devices 201a to 201c measure the positions of reflected light from the positions of the measurement light spots, and focus coordinates are calculated from the positions. The photoreception devices 201a to 201c are analog devices such as CCDs (Charge Coupled Devices) or PSDs (Position Sensitive Detectors). A focus shift amount is obtained by, e.g., obtaining the position of the center of gravity of an intensity profile of the photoreception spots.

Figure 3:
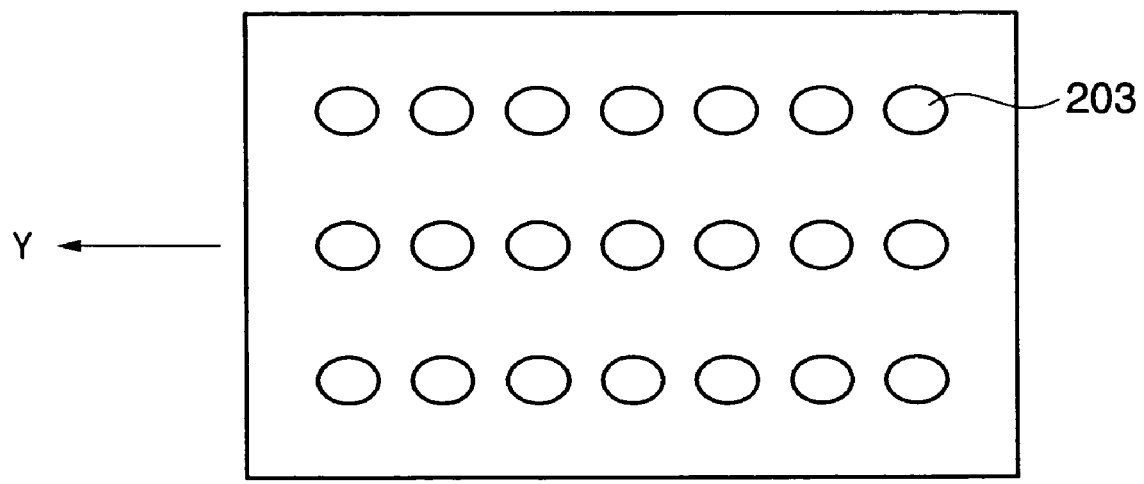
FIG. 3 is an example of a layout of focus measurement positions in a reticle substrate surface.

FIG. 3 is an example of a layout of focus measurement positions (measurement light spots) 203 in the reticle substrate surface. As shown in FIG. 2, in one scanning of the reticle in the scan direction, position measurement can be performed plural times in the focus measurement positions 203 arranged vertically to the scan direction (Y direction). By this measurement, the deflection of the reticle substrate suction-held by a reticle chuck (not shown) is measured. Note that the movement in the reticle can direction is made by the reticle stage 5.

Figure 4:
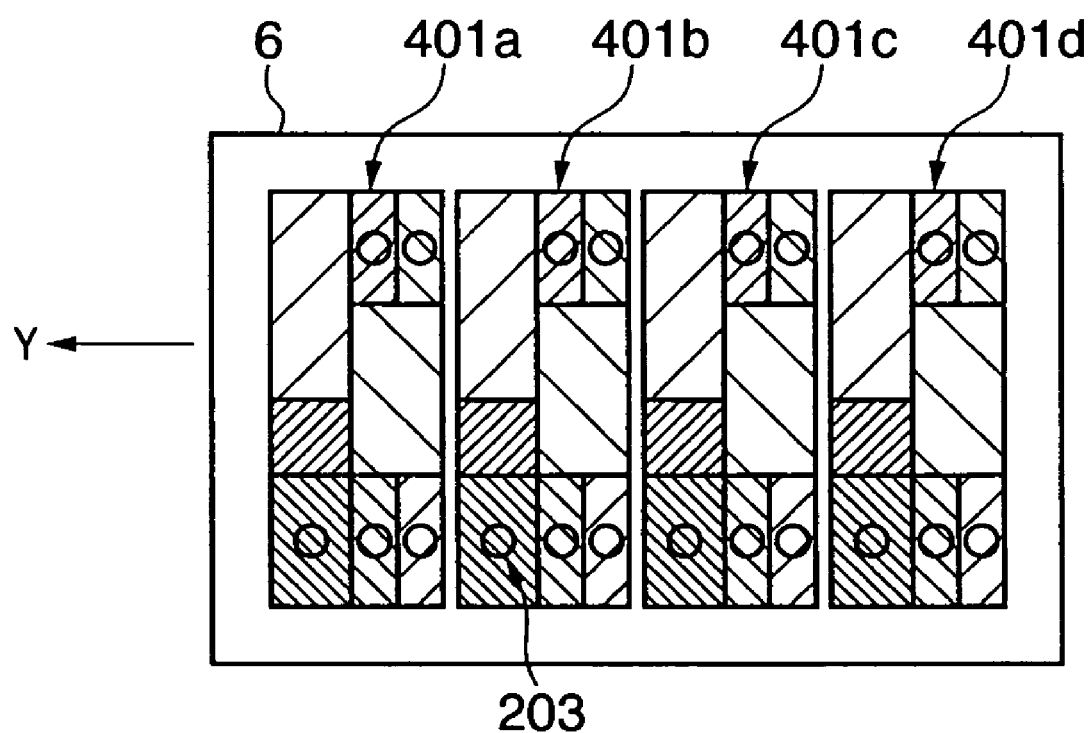
FIG. 4 is an example of a reticle where a pattern is drawn.

FIG. 4 is an example of the reticle where a pattern is drawn. In the present embodiment, device patterns 401a to 401d for four chips are drawn within one shot. In FIG. 4, hatching within each chip indicates that roughness/fineness of the drawing pattern differs in accordance with the position within each chip. The focus measurement value is a mean value of the roughness (rise and fall) in the area of the measurement light spot 203 (note that FIG. 4 does not show all the measurement points). Accordingly, the roughness of the pattern drawn on the reticle causes a variation of focus measurement value, and by extension, causes an error in obtaining the deflection of the entire reticle substrate. Note that, in the present specification, the focus measurement error due to a pattern is referred to as a "pattern deceived amount".

Generally, plural chips arranged within one shot are a repetition of the same pattern. In the same type of chips, the roughness/fineness within each chip results in the same pattern deceived amount in relatively the same position. Accordingly, if focus measurement is performed in the same position in the respective chips having the same pattern, the deflection of the reticle substrate can be calculated without influence of a pattern deceived, due to the patterns drawn on the reticle.

I. To realize this measurement, it is necessary to arrange the reticle focus measurement points to arbitrary positions in accordance with a type of reticle loaded on the exposure apparatus. Further, it is necessary to previously obtain the pattern density on the reticle original plate, then measure the pattern deceived amount from the pattern density, and previously, to select a portion with a small deceived amount or a portion where the deceived amount is uniform in plural measurement points and to arrange the focus measurement points. Further, it is necessary to arrange plural focus measurement points in correspondence with a repetition period of a chip pattern drawn on the reticle or an integer multiple of the period. As the pattern deceived amount in focus measurement value in the reticle pattern depends on the type of pattern drawn on the reticle, it is desirable that the focus measurement point arrangement information of the reticle is also managed in accordance with the type of the reticle pattern.

Figure 11:
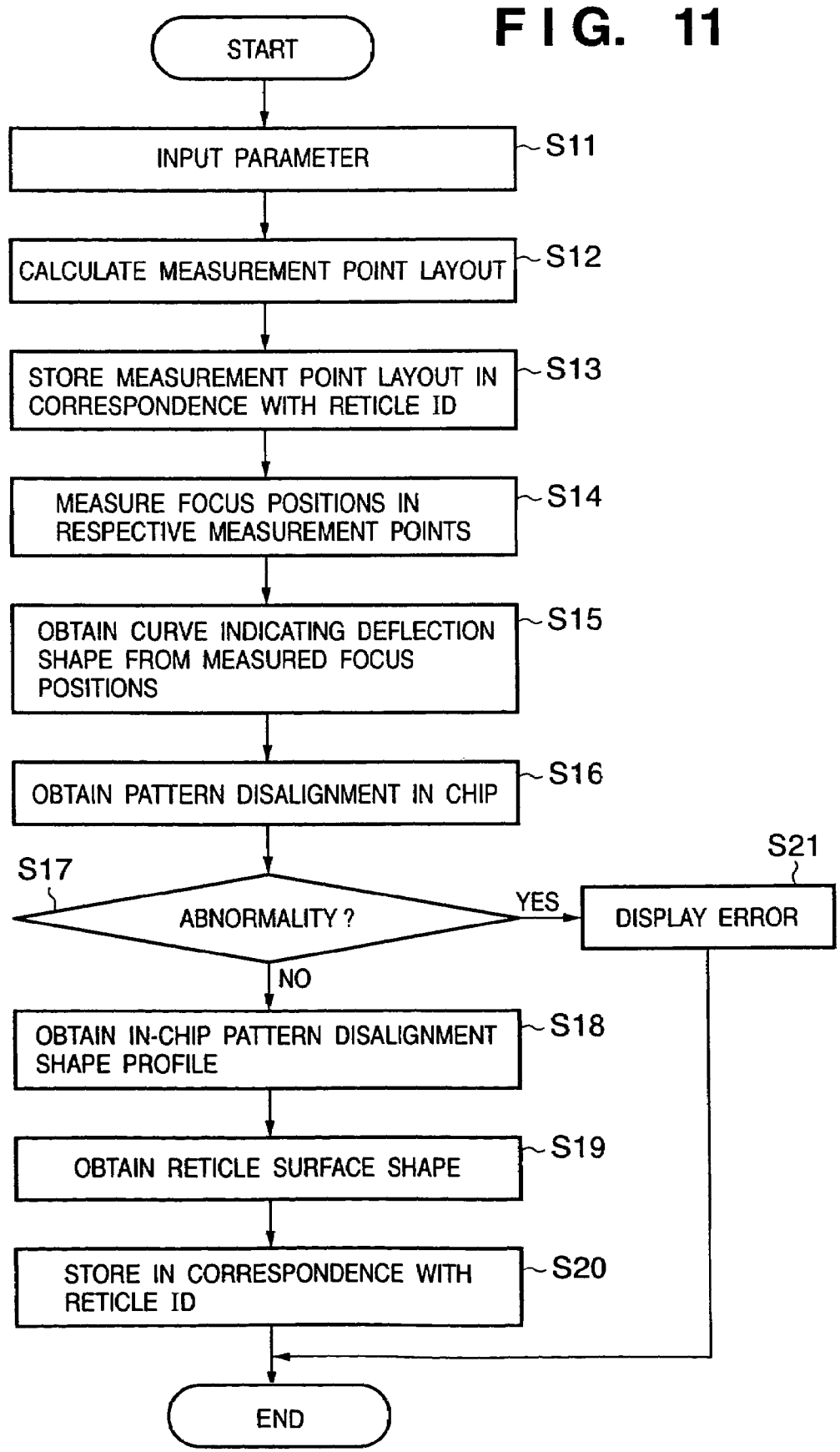
FIG. 11 is a flowchart showing processing to obtain a reticle surface shape according to the present embodiment.

Next, reticle surface shape measurement processing according to the present embodiment will be described in detail. Note that the reticle surface shape measurement processing is performed in accordance with the flowchart of FIG. 11. Respective processings in the flowchart of FIG. 11 will be described with reference to FIGS. 5 to 9.

First, in processing at steps S11 to S13, the measurement points are determined by giving predetermined parameters regarding a reticle as the subject of measurement, and a focus measurement position table is generated. The focus measurement position table is stored into a memory in correspondence with a reticle ID specifying the reticle. This processing will be described later with reference to FIGS. 8 and 9.

At step S14, the reticle surface focus measurement is performed in the measurement positions stored in the focus measurement position table. At step S15, a curve indicating the shape of reticle deflection is obtained from the measured focus positions. These processings will be described with reference to FIG. 5.

Figure 5:
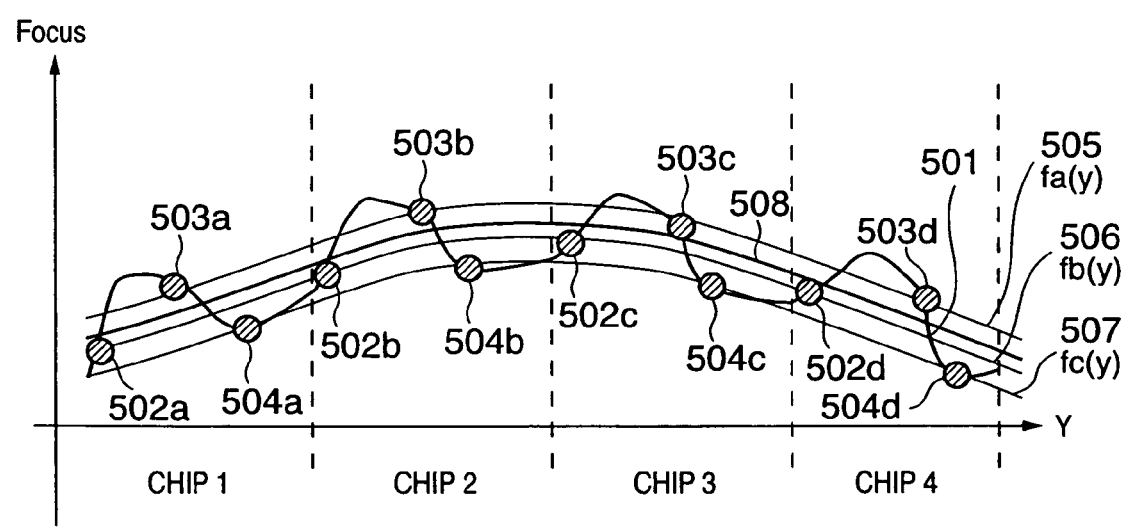
FIG. 5 is a graph showing an example where focus measurement values are plotted in the embodiment.

FIG. 5 is a graph showing an example wherein the focus measurement values are plotted according to the embodiment. In this example, device patterns for four chips are drawn. Numerals 502a to 502d denote measurement data obtained by measuring focus of a reticle pattern surface in the same relative position in each chip. Similarly, numerals 503a to 503d and 504a to 504d denote measurement data obtained in a similar manner. If a comparison is made within one chip, local roughness by misalignment of a reticle pattern in the chip are measured from the data 502a, 503a and 504a. The roughness is repeated in every chip (502b, 503b and 504b, etc.). Note that, in FIG. 5, a curve 501 indicates the shape of a reticle surface to be measured later.

The values obtained by measurement in the same position in the respective chips are connected, then shapes fa(y)505, fb(y)506 and fc(y)507 are obtained. Thus, profiles without influence of roughness of the pattern drawn on the reticle can be measured. Note that, in this example, the measurement values are connected with a curve of the second order. Further, numeral 508 denotes a profile as a mean of constant terms (offset components) of expressions of the curves fa(y)505, fb(y)506 and fc(y)507. The profile 508 represents a shape of a reticle substrate (reticle deflection shape) without influence of a pattern deceived amount of focus measurement values due to the pattern drawn on the reticle.

Next, at step S16, the pattern misalignment within one chip is obtained. If there is not abnormality in the data (step S17), the process proceeds to step S18, at which an in-chip pattern misalignment shape profile indicating the shape of pattern misalignment in one chip is obtained. The processing at steps S16 to S18 will be described with reference to FIG. 6.

Figure 6:
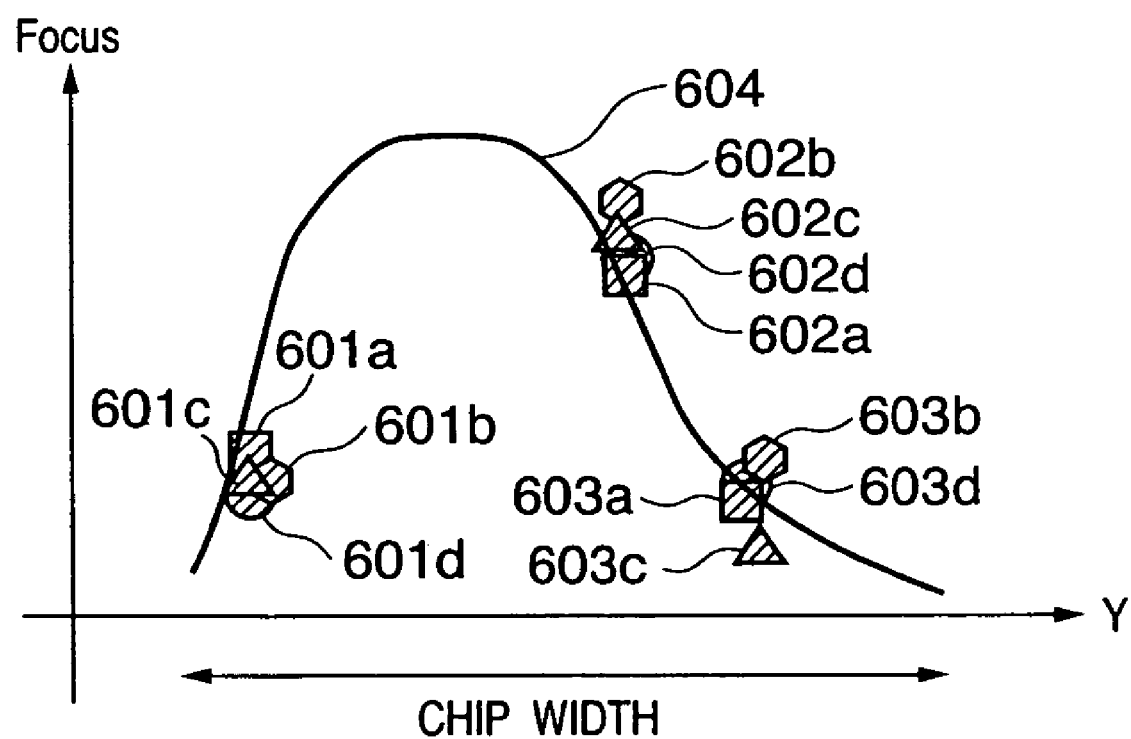
FIG. 6 is a graph explaining estimation of an in-chip focus shape profile of a reticle pattern.

FIG. 6 is a graph explaining an algorithm for estimation of an in-chip focus shape profile of a reticle pattern. To obtain plot points in FIG. 6, it is necessary to perform the following processing on the result of the measurement shown in FIG. 5.

(1) Approximate curves (fa(y)505, fb(y)506 and fc(y)507) connecting the measurement points in the same positions in the respective chips are obtained.

(2) In the present embodiment, the curves fa(y)505, fb(y)506 and fc(y)507 are approximated as curves of the second order. The order of approximate curves may be higher if the number of chips drawn in the reticle is large. In this example, the three approximate curves are obtained from the three measurement points arranged in the chip, and a mean value of constant terms of the approximate curves is the curve 508 that represents the deflection shape of the reticle. ((1) and (2) correspond to processing at step S15.)

(3) In the respective focus measurement points, pattern misalignment (601a to 601d, 602a to 602d, and 603a to 603d) can be obtained by subtracting the reticle substrate shape component 508 from the focus measurement values (502a to 502d, 503a to 503d, and 504a to 504d) (step S16). Note that it is apparent that pattern misalignment may also exist on the minus side. However, to obtain the shape of misalignment, it is sufficient to obtain a relative relation among the measurement values. Accordingly, FIG. 6 shows the relative relation among the pattern misalignment values and the substrate shape component).

FIG. 6 shows a shape approximate curve of an in-chip reticle pattern obtained based on these pattern misalignment values (step S18).

In FIG. 6, numeral 604 denotes an approximate curve obtained with respect to a sample point subjected to the processings (1) and (2), as an in-chip pattern misalignment profile. For example, the curve 604 corresponds to a polynomial expression represented with a cubic or finite-order function obtained by a least squares method with respect to the sample point. Other methods to obtain an approximate curve, such as a method using abnormal value elimination and a mean value, and regarding the shape of the approximate curve, or a method to regard the curve as a spline curve, may be used. Further, in the present embodiment, for the sake of convenience of explanation, the approximate function representing the deflection of the reticle substrate is expressed with a two-dimensional curve. However, it is also desirable as an embodiment of the present invention to express the approximate function with a three-dimensional curved surface. Note that the above processing is applicable to processing in the tilt direction as well as in the focus direction.

Note that in a case wherein the focus measurement values in the same position in the chips (e.g., 601a to 601d) are far from a predetermined value, the focus measurement value deceived amount in the drawing pattern in the same position in the chips is not reproduced, and by extension, the reliability of the obtained deflection shape curve 508 of the reticle substrate is low. Causes of such degradation of reliability may be deformation of a reticle substrate due to dust existing between the reticle and a reticle suction pad (not shown) provided on the reticle stage 5 or attachment of dust to the reticle pattern. Accordingly, in a case wherein the distribution of focus measurement values in the same position in the chips is large, it is desirable to detect the state as an error and to produce a display to require cleaning of the reticle or reticle stage (steps S17 and S21).

When the in-chip pattern misalignment shape profile has been obtained as described above, the reticle surface shape is obtained by using the profile at step S19. The reticle surface shape is stored, in correspondence with the reticle ID, into the memory. When exposure processing is performed, using the reticle, Z-directional alignment control is performed on the wafer stage (or reticle stage) based on the reticle surface shape profile. Note that in a case wherein the Z-directional alignment control can be sufficiently performed only by using the profile of the shape of deflection obtained at step S15, the alignment control may be performed using the profile obtained at step S15.

Next, steps S19 and S20 will be described.

Figure 7:
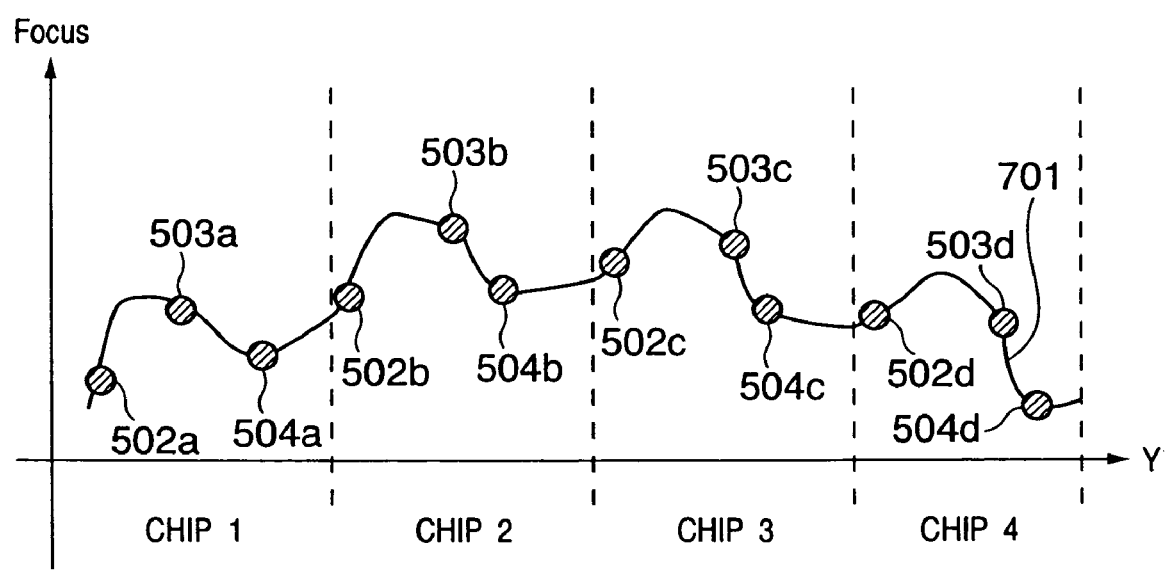
FIG. 7 is a graph showing the result of measurement of the shape of a reticle surface obtained in the embodiment.

FIG. 7 is a graph showing the result of a measurement of the shape of the entire reticle in the focus direction obtained in the present embodiment. A reticle surface shape 701 can be obtained by the following procedure.

(1) An in-chip pattern misalignment shape profile 604 is obtained by the above-described procedure (step S18).

(2) The in-chip pattern misalignment shape profile 604 is added to the reticle substrate deflection shape curve 508 as the reticle surface shape 701 (step S19).

In the present embodiment, the reticle surface shape 701, including pattern misalignment, is measured by the reticle, and the result is stored by the reticle (step S20). The stored shape data is compared with shape data generated by performing the same measurement processing (steps S14 to S19) at each reticle load timing. Thereby, deformation of each reticle and/or attachment of dust to the pattern surface can be detected.

Figure 8:
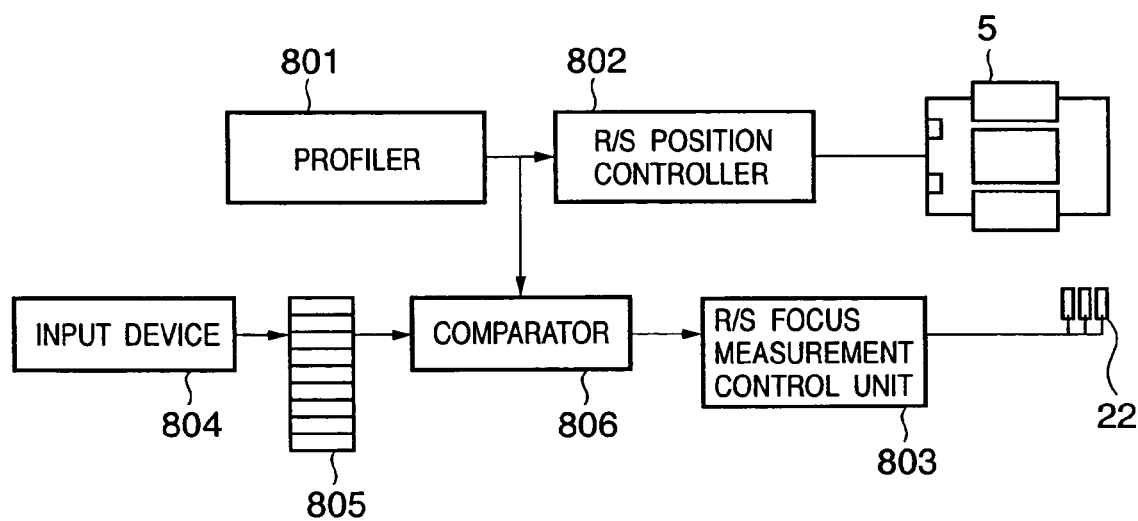
FIG. 8 is a block diagram showing a control construction of a reticle focus measurement mechanism.

FIG. 8 is a block diagram showing a control construction of a reticle focus measurement mechanism (a mechanism to control the measurement processing at step S14) according to the present embodiment. Numeral 801 denotes a profiler, which is a module having a function of sequentially generating XY axial drive target values for the reticle stage 5. The reticle stage 5 is positioned by a reticle stage (R/S) position controller 802 to a position designated by the profiler 801. In the present embodiment, the mechanism performs measurement to obtain shape data of a reticle placed on the reticle stage 5, while the reticle is subjected to constant-speed scanning. Accordingly, it is necessary to issue a command to start measurement to an R/S focus measurement control unit 803 at a timing of arrival of the reticle stage 5 at a predetermined reticle focus measurement position.

A comparator 806 monitors the target values generated by the profiler 801, and upon arrival of the reticle stage 5 at the reticle focus measurement position, transmits the measurement command to the R/S focus measurement control unit 803. The reticle focus measurement position, as the subject of comparison by the comparator 806, is inputted by an input device 804, which is capable of inputting plural arbitrary positions, and is stored in a focus measurement position table 805. When the reticle stage scan drive is started to measure the reticle shape, the focus measurement positions are sequentially read, from a position closest to the scan start position, from the focus measurement position table 805, and set as the subject of measurement position comparison. Note that, as the input device 804, a console of the exposure apparatus can be utilized.

Figure 9:
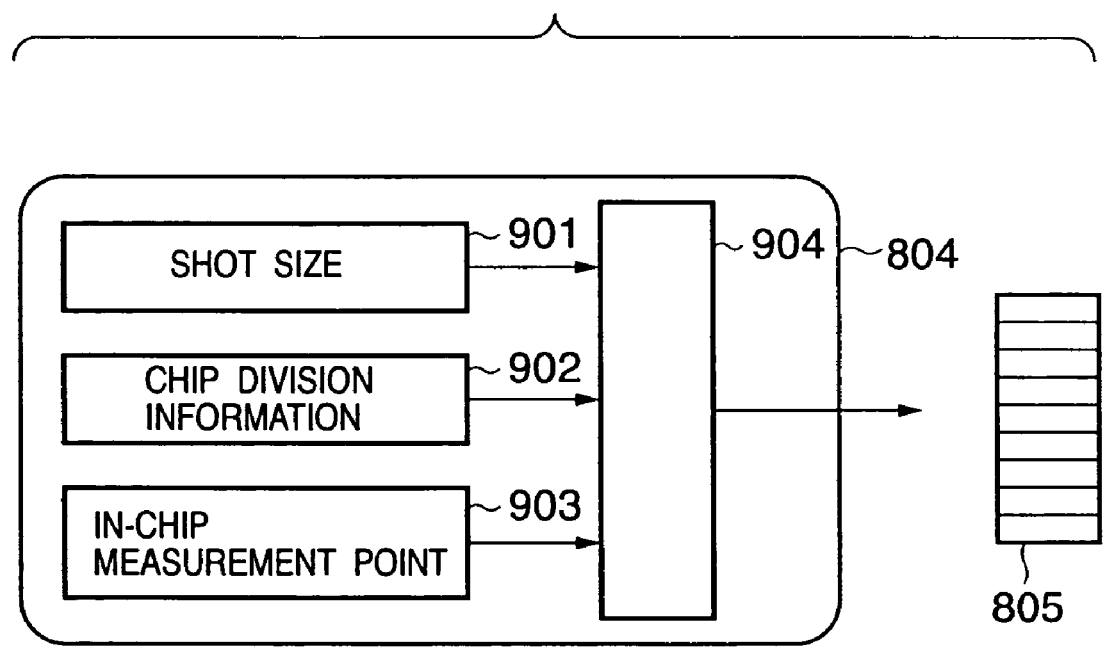
FIG. 9 is an explanatory diagram showing a method of generating a focus measurement position table.

FIG. 9 is an explanatory diagram showing a method of generating the locus measurement position table 805 described in FIG. 8 (steps S11 to S13). The input device 804 inputs a shot size 901 of a shot drawn on the reticle and chip division information 902 (e.g., the number of chips, an array pitch, and the like). The position and size of each chip pattern can be obtained from the information. Further, one or plural desired in-chip focus measurement points (in-chip measurement points 903) are designated for the plural reticle focus measurement devices 22. At measurement point layout calculation 904, the focus measurement position table 805 is generated based on the designated conditions 901 to 903 (step S12). That is, based on the designated measurement point and the input information, the focus measurement positions in plural chips as shown in FIG. 4 are calculated and the focus measurement position table 805 is generated. Note that it may be arranged such that the in-chip measurement point 903 is automatically set from drawing density information, or the like, obtained from the reticle pattern drawing information, or such that the user designates the measurement point by reticle. The generated focus measurement position table 805 is stored, in correspondence with the ID to specify the reticle as the subject of measurement, into the memory (step S13).

FIG. 12 is an example of a user interface to input the shot size 901. Such a user interface can be realized with a GUI using a mouse, a touch panel, or the like. In "Area X" and "Area Y", X- and Y-directional sizes in the shot area are designated. In "Center X" and "Center Y", the X- and Y-directional centers of the shot are designated. In accordance with depression of a "Further Info." button, the screen changes to a setup image for the chip division information 902. FIG. 13 is an example of a user interface of the chip division information setting screen. In "Shot Segmentation X" and "Shot Segmentation Y", the number of X-directional chips and the number of Y-directional chips are designated. Note that if an "AUTO" button is depressed, the focus measurement positions on one chip are calculated based on the shot size 901 and the chip division information 902, and the measurement start position ("Measurement Start Point") and the measurement interval ("Measurement Interval") are displayed. In the case of a manual designation, numerical values are inputted in the "Measurement Start Point" and "Measurement Interval". Note that the measurement start position corresponds to a distance from a chip start position to a first measurement point, and the measurement interval, to a distance between measurement points.

Figure 14A:
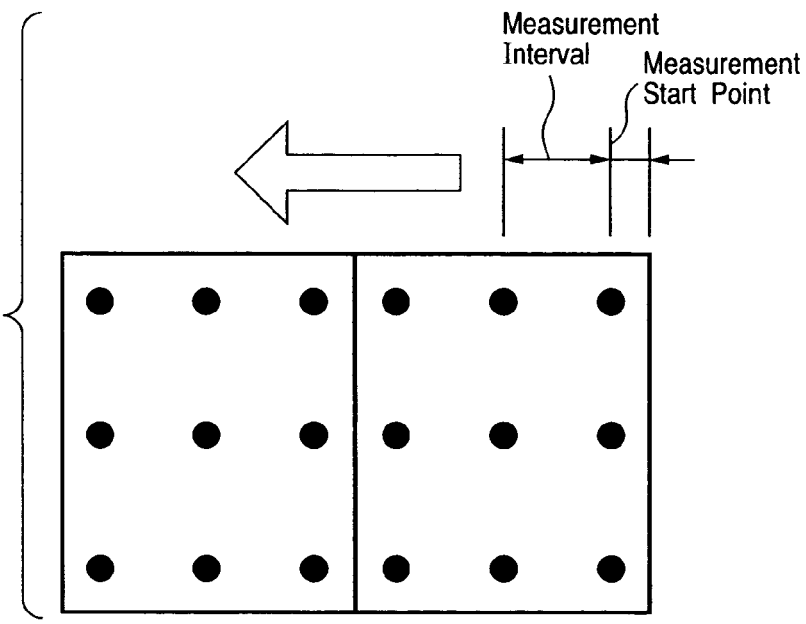
FIGS. 14A and 14B are examples of measurement point setting.
Figure 14B:
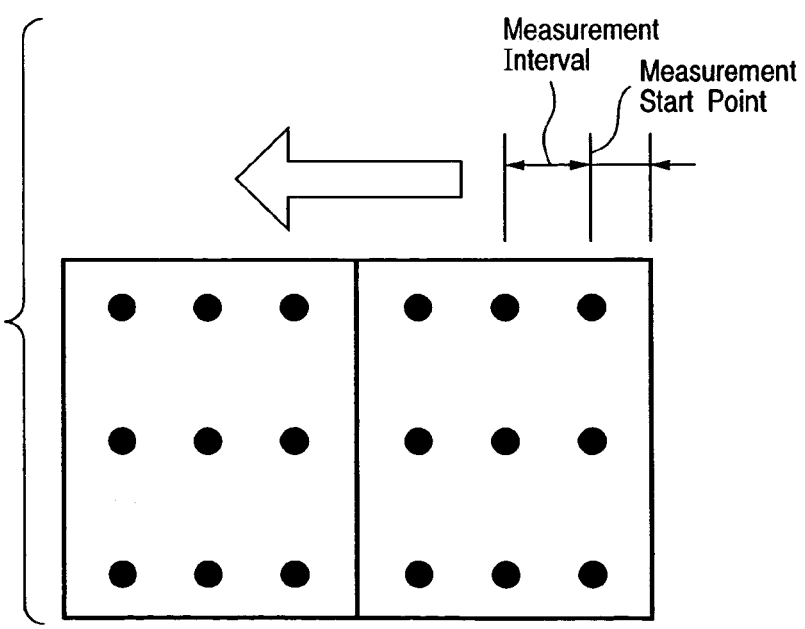

Further, in the automatic calculation, a calculation is made such that, for example, measurement points are arranged as uniformly as possible in the chip. The interval between the measurement points assures the degree of following by signal processing in the measurement system. Further, it is conceivable that if measurement is made at a predetermined interval, but is made over an adjacent chip due to the chip size, the condition is not satisfied. For example, in the case of FIG. 14A, the initial measurement points and the final measurement points in adjacent chips (black points in FIGS. 14A and 14B) are inconveniently too close. Then, as shown in FIG. 14B, the measurement point interval and the start point are set such that "the measurement points are concentrated toward the chip center".

Further, the drawing density information may also be obtained from a reticle writer. For example, the amount of drawing data in a unit field (100 to 500 μm) of an electron beam (EB) drawing apparatus is converted to a pattern-density focus deceived amount, and is supplied as a table for the entire reticle. Note that the designation of the reticle focus measurement position is limited as to designation of the Y position with high accuracy. Accordingly, it is desirable that a position where the Y position may be somewhat shifted (a position with a low pattern density or a uniform pattern density) is selected. Thereby, measurement reproducibility is improved.

Note that if a graphical interface can be provided, it may be arranged such that the chip pattern arrangement as shown in FIG. 4 is displayed and a designated measurement point can be designated with a pointing device in one of the chip patterns.

Note that, in the above description, as the focus measurement positions are represented with one interval, focus measurement is performed at the same interval in the plural focus measurement sensors. However, it may be arranged such that the interval is individually set for the respective focus measurement sensors.

The problem noted in the present embodiment and the basic features to solve the problem are as follows.

Roughness (rise and fall) exists in the reticle 6 due to a pattern drawn on the reticle. If the pattern is measured with the deformation of the reticle, the shape measurement value of the reticle substrate itself is to be initially obtained as an error. Accordingly, it is necessary to separate the shape of misalignment due to the pattern from the result of the reticle focus measurement.

The maximum view angle size (1 shot) of a general scan exposure apparatus is 26 mm×33 mm, and the size of a chip to be cut out as a product is about 100 mm² for a general memory or processor. Accordingly, in a pattern layout of a reticle for mass production of such chips, generally, the shot size is fully used in a state in which plural chips are arrayed in a reticle scan direction. The component of the deflection of the reticle substrate is separated from the roughness due to misalignment of a pattern drawn on the reticle by utilizing the chip layout arranged in the shot as a settled repeated pattern.

In brief, by tracking variations in focus measurement values in the same coordinates in the chips, the differential value becomes the amount of deflection of the reticle without influence of the roughness due to the pattern. Further, if plural in-chip measurement points in the scan direction are provided, as described in FIG. 4, and the interpolation method, as described in the present embodiment, is used, a more detailed shape of roughness of the pattern drawn on the reticle can be obtained.

The deflection data of the reticle substrate surface obtained by the above method is subjected to interpolation-calculation and reflected in the trail of the wafer stage 16 upon wafer exposure. The trail 1002 of image surface variation upon scan exposure, which occurred due to the deflection of the reticle suction-held on the reticle stage 5, is followed by a wafer stage target position trail obtained by the above correction calculation. Thus, the amount of defocus due to the deflection of the reticle is resolved and an excellent exposure result can be obtained.

That is, according to the present embodiment, a scan exposure apparatus is provided with respective means for separating the amount of erroneous focus measurement due to a pattern drawn on a reticle, and the amount of deflection of the reticle substrate suction-held on a reticle stage can be accurately measured. Then, by using the method of the present embodiment, the amount of reticle deflection is converted to the amount of variation of image forming surface of the reticle pattern and for correcting the amount of focusing upon exposure. Thereby, excellent resolution performance can be obtained in scan exposure.

As described above, according to the present embodiment, in an exposure apparatus or a reticle shape measurement apparatus having a stage to carry and move a reticle and measurement means for measuring a focus position in plural measurement positions on the surface of the reticle placed on the stage, designation means for designating measurement positions by the measurement means is provided. Accordingly, reticle OPTF measurement positions can be designated at random in correspondence with a reticle pattern. Further, according to the present embodiment, an exposure apparatus or a reticle shape measurement apparatus having a user interface to execute such a designation is provided. Further, the influence of roughness of a pattern can be more effectively eliminated by selecting a position at which a reticle pattern density is comparatively close as the position of reticle OPTF measurement. Further, the measurement can be made in the same position in repeatedly arranged plural chips by designating the position of reticle OPTF measurement to be an interval or integral submultiple of a chip layout in one shot.

Further, it is preferable to provide a function of holding the above-measured reticle OPTF measurement position information as data by a reticle or data by a reticle type.

Further, according to the present embodiment, provided is an exposure apparatus or a reticle shape measurement apparatus having a stage to carry and move a reticle on which plural chips are arranged, measurement means for measuring a focus position of respective positions in the plural chips on the reticle placed on the stage, and estimation means for estimating the shape of deflection of the reticle in a stage moving direction based on the focus position measured by the measurement means. As the shape of reticle deflection, a shape, wherein the shape of roughness of chip pattern is eliminated, can be obtained.

Further, the measurement means performs measurement of focus position in plural positions in a chip by each of plural chips. The shape of roughness due to a drawing pattern by a chip can be calculated based on the respective measurement values in the plural in-chip positions by the measurement means.

Further, in the respective measurement values in the plural in-chip positions measured by the measurement means, if the variations in the focus position measurement value in the same position exceed a threshold value, the status is notified. Thereby, the possibility of attachment of dust, or the like, to a reticle chuck, can be indicated.

Further, based on the measurement values in the plural in-chip positions by the measurement means, the shape of reticle deflection, at which the amount of roughness due to the in-chip pattern is eliminated, can be estimated. For example, statistical calculation processing is performed to obtain a deflection curve or a deflection surface of the reticle from the results of plural pairs of reticle OPTF measurements at a chip arrangement interval on the reticle. Thereby, the shape of a reticle, at which a pattern deceived amount is eliminated, is obtained. Thus, an excellent focus state can be maintained by reflecting the reticle shape in a target value upon wafer stage drive.

Further, the surface shape of the reticle can be obtained by combining the shapes of roughness of the drawing patterns in the respective chips obtained by the above calculation with the above-estimated reticle deflection shape.

As described above, according to the present invention, upon measurement of reticle focus position, the influence of a reticle pattern can be eliminated, and exposure processing can be performed in excellent resolution.

As many apparently widely different embodiments of the present invention can be made without departing from the spirit and scope thereof, it is to be understood that the invention is not limited to the specific embodiments thereof except as defined in the appended claims.

What is claimed is:

1. An exposure apparatus for exposing a substrate to light via a reticle while the substrate and the reticle are scanned in a scanning direction, based on information of a shape of the reticle, the reticle having a plurality of chip patterns arranged along the scanning direction with a space arranged therebetween, said apparatus comprising:

a projection optical system configured to project light from the reticle onto the substrate;

a reticle stage configured to hold the reticle and to be moved in the scanning direction;

a measurement system configured to measure a position of a surface of the reticle in a direction of an optical axis of said projection optical system; and a controller configured to generate information regarding positions of measurement points to be arranged on the surface so that at least a pair of the measurement points are arranged at a repetition period of the plurality of chip patterns or an integer multiple of the period in the scanning direction, based on information of the plurality of chip patterns, measurement performed by said measurement system with respect to the measurement points being used to obtain the information regarding the shape, and said controller being further configured to control a position of said reticle stage to move the reticle in the scanning direction, and to control an operation of said measurement system based on the generated information and information regarding the controlled position of said reticle stage so that said measurement system measures a position of the surface with respect to each of the measurement points while the reticle is moved on the scanning direction.

2. An apparatus according to claim 1, wherein said controller is further configured to generate the information regarding positions of the measurement points point based on information regarding a size of each of the plurality of chip patterns, and information of an arrangement of each of the plurality of chip patterns.

3. An apparatus according to claim 1, wherein said controller is further configured to generate information regarding positions of plural measurement points with respect to each of the plurality of chip patterns as the information regarding positions of the measurement points.

4. An apparatus according to claim 1, further comprising a user interface configured to input information, based on which, said controller generates the information regarding positions of the measurement points.

5. An apparatus according to claim 1, wherein said controller is configured to generate the information regarding positions of the measurement points so that each of a plurality of pairs of the measurement points are arranged at the interval of the plurality of chip patterns, to find an approximate curve for the measured positions of the surface with respect to each of the plurality of pairs, to find the shape based on the found approximate curves, and to find a difference between the found approximate curve and the found shape with respect to each of the plurality of the pairs.

6. An apparatus according to claim 5, wherein said apparatus is configured to store one of information regarding the found shape and information regarding a shape obtained by adding the found shape and the found differences.

7. A method applied to an exposure apparatus for exposing a substrate to light via a reticle, while the substrate and the reticle are scanned in a scanning direction, based on information regarding a shape of the reticle, the reticle having a plurality of chip patterns arranged along the scanning direction, the exposure apparatus including a projection optical system configured to project light from the reticle onto the substrate, a reticle stage configured to hold the reticle and to be moved in the scanning direction, and a measurement system configured to measure a position of a surface of the reticle in a direction of an optical axis of the projection optical system, said method comprising steps of:

generating information regarding positions of measurement points to be arranged on the surface so that at least a pair of the measurement points are arranged at a repetition period of the plurality of chip patterns or an integer multiple of the period in the scanning direction, based on information regarding the plurality of chip patterns, measurement performed by the measurement system with respect to the measurement points being used to obtain the information regarding the shape;

controlling a position of the reticle stage to move the reticle in the scanning direction; and controlling an operation of the measurement system based on the generated information and information regarding the controlled position of the reticle stage so that said measurement system measures a position of the surface with respect to each of the measurement points while the reticle is moved in the scanning direction.

8. A method according to claim 7, wherein said generating step generates the information regarding positions of the measurement points based on information regarding a size of each of the plurality of chip patterns, and information of an arrangement of each of the plurality of chip patterns.

9. A method according to claim 7, wherein said generating step generates information regarding positions of plural measurement points with respect to each of the plurality of chip patterns as the information regarding positions of the measurement points.

10. A method according to claim 7, further comprising a step of inputting, via a user interface included in the exposure apparatus, information, based on which, said generating step generates the information regarding positions of the measurement points.

11. A method according to claim 7, wherein said generating step generates the information regarding positions of the measurement points so that each of a plurality of pairs of the measurement points are arranged at the interval of the plurality of chip patterns, said method further comprising steps of:

finding an approximate curve for the measured positions of the surface with respect to each of the plurality of pairs;

finding the shape based on the found approximate curves; and finding a difference between the found approximate curve and the found shape with respect to each of the plurality of the pairs.

12. A method according to claim 11, further comprising a step of storing one of information regarding the found shape and information regarding a shape obtained by adding the found shape and the found differences.

* * * * *

UNITED STATES PATENT AND TRADEMARK OFFICE
CERTIFICATE OF CORRECTION

PATENT NO. : 7,315,350 B2
APPLICATION NO. : 10/843462
DATED : January 1, 2008
INVENTOR(S) : Hiroshi Kurosawa It is certified that error appears in the above-identified patent and that said Letters Patent is hereby corrected as shown below:

COLUMN 1:
      Line 58, "has its object" should read -- has as its object --.

COLUMN 3:
      Line 34, "wafer stage 6" should read -- wafer stage 16 --.

COLUMN 6:
      Line 4, "thereby" should read -- whereby --.
      Line 38, "reticle can" should read -- reticle scan --.
      Line 65, "I." should be deleted and a new paragraph should begin with "To realize".

COLUMN 7:
      Line 45, "are measured" should read -- is measured --.

COLUMN 9:
      Line 61, "locus" should read -- focus --.

Signed and Sealed this

Twenty-ninth Day of July, 2008

JON W. DUDAS
*Director of the United States Patent and Trademark Office*